(12) United States Patent
Schertler

(10) Patent No.: US 6,325,856 B1
(45) Date of Patent: Dec. 4, 2001

(54) VACUUM TREATMENT EQUIPMENT

(75) Inventor: Roman Schertler, Wolfurt (AT)

(73) Assignee: Unaxis Balzers Aktiengesellschaft, Fuerstentum (LI)

(*) Notice: Subject to any disclaimer, the term of this patent is extended or adjusted under 35 U.S.C. 154(b) by 0 days.

(21) Appl. No.: 09/338,569

(22) Filed: Jun. 23, 1999

Related U.S. Application Data

(63) Continuation of application No. PCT/CH97/00481, filed on Dec. 23, 1997.

(30) Foreign Application Priority Data

Dec. 23, 1996 (CH) .................................................. 3178/96

(51) Int. Cl.⁷ ........................... C23C 16/00; C23C 14/00; B65G 49/07
(52) U.S. Cl. ..................... 118/719; 118/733; 204/298.23; 204/298.25; 204/298.28; 204/298.35; 414/217; 414/221; 414/935; 414/939; 156/345; 427/248.1; 427/255.7
(58) Field of Search ...................................... 118/719, 733; 204/298.23, 298.25, 298.26, 298.28, 298.35; 414/217, 221, 935, 939; 156/345; 427/248.1, 255.7

(56) References Cited

U.S. PATENT DOCUMENTS

| | | | |
|---|---|---|---|
| 3,598,083 | * | 8/1971 | Dort et al. ............................ 118/730 |
| 4,226,208 | * | 10/1980 | Nishida et al. ......................... 18/706 |
| 4,987,856 | * | 1/1991 | Hey et al. ............................ 118/723 |
| 5,281,320 | * | 1/1994 | Turner et al. ...................... 204/298.15 |
| 5,435,683 | * | 7/1995 | Oosawa et al. ........................ 414/217 |
| 5,549,435 | * | 8/1996 | Schertler ............................. 414/217 |
| 5,590,994 | * | 1/1997 | Schertler ............................. 414/217 |
| 5,616,224 | * | 4/1997 | Boling ............................. 204/298.28 |
| 5,655,277 | * | 8/1997 | Galdos et al. ......................... 29/33 P |
| 5,662,785 | * | 9/1997 | Schertler .......................... 204/298.25 |
| 5,709,785 | * | 1/1998 | LeBlanc et al. .................. 204/298.25 |
| 5,720,821 | * | 2/1998 | Halpern ............................... 118/719 |
| 5,849,087 | * | 12/1998 | Kloberdanz et al. ................. 118/719 |
| 6,033,480 | * | 3/2000 | Chen et al. ........................... 118/715 |
| 6,066,210 | * | 5/2000 | Yonemitsu et al. ................... 118/719 |
| 6,086,728 | * | 7/2000 | Schwartz et al. ................ 204/192.12 |

FOREIGN PATENT DOCUMENTS

| | | |
|---|---|---|
| 0136562 | 4/1985 | (EP) . |
| 0555764 | 8/1993 | (EP) . |
| 591706 | 4/1994 | (EP) . |

OTHER PUBLICATIONS

Patent Abstract of Japan, vol. 096, No. 002, Feb. 29, 1996.

International Search Report, Mar. 19, 1998.

* cited by examiner

Primary Examiner—Jeffrie R. Lund
(74) Attorney, Agent, or Firm—Crowell & Moring LLP

(57) ABSTRACT

A vacuum treatment system has an outer housing which defines a substantially cylindrical inner wall around an axis. At least two openings are provided for treating or conveying-through a respective workpiece arranged along at least one great circle of the cylindrical inner wall. One treatment, conveying or lock chamber respectively, is connected with the at least two openings. An inner housing defines a cylindrical outer wall and, together with the substantially cylindrical inner wall, forms a substantially cylindrical ring gap. A workpiece carrier carousel is rotationally drivable about the axis in the ring gap. A feed device comprising driving devices is movable in a radially driven manner on the inner housing and is aligned with the at least two openings. The driving devices act into the ring gap, and each of the driving devices has a separate drive.

42 Claims, 10 Drawing Sheets

VACUUM TREATMENT EQUIPMENT

CROSS-REFERENCE TO RELATED APPLICATIONS

This application is a continuation of PCT Application No. PCT/CH97/00481 filed on Dec. 23, 1997.

This application is related to an application Ser. No. 09/338560 entitled "VACUUM TREATMENT EQUIPMENT" filed on Jun. 23, 1999.

BACKGROUND OF THE INVENTION

The present invention relates to vacuum treatment systems, and to a vacuum chamber.

EP-0 136 562 discloses a known vacuum treatment system with feeding devices, which are provided on the inner housing and are aligned with the provided treatment chambers and their openings. Radially driven, movable slides serve as driving devices, are mechanically frictionally, synchronously and with the same stroke driven by a central wedge-type drive.

It is a disadvantage in this known approach that it is not possible to design the feed differently for the various provided treatment chambers, as, for example, for meeting different sealing requirements. Furthermore, a respective provided slide must also be actuated when no treatment chamber at all is provided at the opening assigned to it, in that, for example, with the known system, in a flexible manner, a process is to be implemented which requires fewer treatment steps.

Even if, for example, one of the treatment chambers does not require a feeding movement of the workpiece against its opening, as, for example, a heating chamber, a feeding stroke is also carried out there on the known system.

Another major disadvantage of the known system is that the slide stroke movements are wedge-driven. Thus, the stroke is affected by wear. Consequently, workpiece carrier plates are lifted from the carousel against the respective openings and are sealingly placed there against the edge of the opening. Even if the stroke on the known system, as the result of wear, changes only a little, the desired sealing conditions also change, which is intolerable with certain difficult machining processes.

SUMMARY OF THE INVENTION

An object of the present invention is to eliminate such disadvantages. Based on a system of vacuum treatment, this object has been achieved by providing that each driving device has a separate drive.

Another object of the present invention is to overcome the wear and sealing problem. Within the scope of the present invention, sealing is effected by a no-contact sealing-off, as by forming a pressure stage by way of a labyrinth seal, as well as a form-locking and/or force-locking sealing.

Because the solution of this problem can also be applied to systems which do not all have the characteristics according to EP-0 136 562, according to a second aspect, the present invention is based on a vacuum treatment system which can be constructed such that a fluid-controlled, preferably pneumatically or hydraulically controlled sealing arrangement is operatively connected wit at least one of the openings, by means of which sealing arrangement a sealing extending around the opening is established and released between the opening bordering and one workpiece receiving device respectively or the workpiece itself.

In this latter aspect, at least one of the openings comprises a fluid-controlled, preferably pneumatically or hydraulically controlled sealing arrangement, or active seal, so that a seal extends around the opening, or is released between the opening edge and a workpiece receiving device or a workpiece itself. As a result, the extent of the seal to be provided can always be advantageously maintained in a constantly uniform manner because, as the result of the pneumatic or hydraulic control, a respectively provided sealing pressure becomes independent of mechanical influences.

One embodiment of the vacuum chamber requires no or only slight lift-off strokes of the workpiece carrier from treatment openings or conveying openings in the wall of the vacuum chamber and is particularly suitable for a use of the above-mentioned active seals.

Other objects, advantages and novel features of the present invention will become apparent from the following detailed description of the invention when considered in conjunction with the accompanying drawings.

DETAILED DESCRIPTION OF THE DRAWINGS

Figure 1:
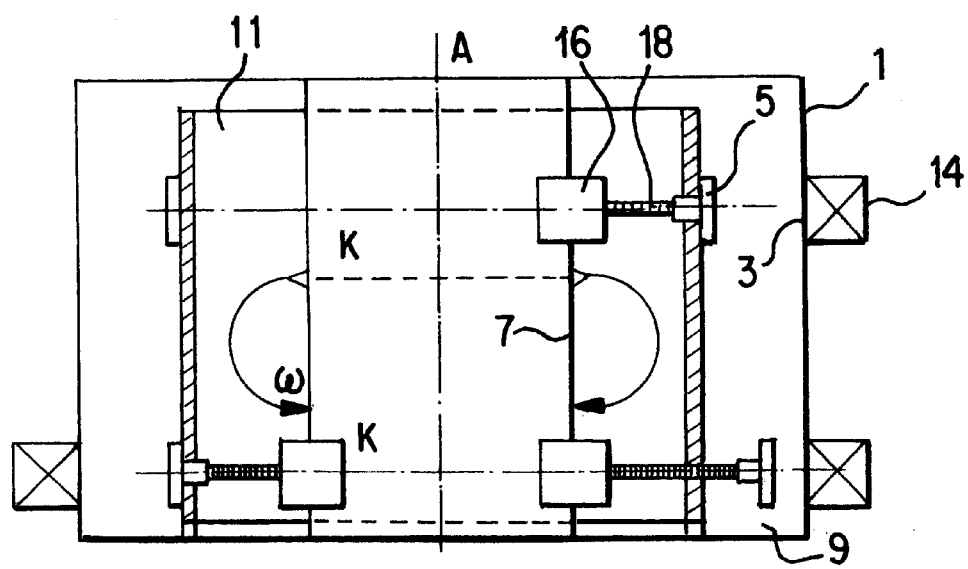
FIG. 1 is a schematic elevational view of a first embodiment of a system according to the present invention.

FIG. 1 is a schematic view of a system of the basic type shown in EP-A-0 136 562, but further developed according to the first aspect of the present invention.

Openings 3 are provided on an outer housing 1, which is cylindrically constructed essentially around an axis A along at least one (as illustrated along two great circles K) for the conveying-through or treatment of workpieces 5. Treatment chambers are arranged on the openings 3 and are generally coating, etching, cooling, heating, conveying, or lock chambers, preferably at least one surface treatment chamber, preferably a plasma surface treatment chamber. In this illustrated embodiment, the chamber is preferably an atomization chamber, particularly with a magnetron source.

Together with the inner wall of the outer housing 1, the outer wall of an inner housing 7 also forms a ring-shaped conveying chamber 9 which is essentially cylindrical with respect to the axis A. A carousel 11 is rotationally driven as designated by X with respect to the axis A, on which carousel, along the above-mentioned great circles K, the workpieces 5, in this case preferably disk-shaped workpieces, are deposited and held on this carousel 11. These workpieces are preferably storage disks, such as CD's, DVD's, HD's, particularly rewritable storage disks, such as MOD's, phase change disks and RC's (recordable disks). As the result of the rotary movement ω of the carousel 11 about the axis A, the workpieces 5 are successively positioned on one or several great circles K opposite openings 3 of the respective chambers 14.

According to the present invention, drives 16 are provided on the inner housing 7, which drives are each situated opposite the openings 3. Thereby, slides 18 are moved as driving devices radially against the openings 3 or are moved back from the latter. Whether directly or indirectly, for example, by way of a receiving plate (not shown), the slides 18 act upon the correspondingly positioned workpieces 5, and their advance moves the workpieces 5 to the required extent toward and back from the openings 3. On one hand, each of the drives 16 can be activated when desired and, on the other hand, its stroke can specifically be sized as required by the respective machining at the respective chamber 14. If the chamber 14 is, for example, a lock chamber, a slightly larger stroke may be required at the corresponding drive 16 than at other chambers in order to achieve a sealing in the opening area 3 which meets higher requirements.

As therefore illustrated in FIG. 1, each of the provided slides is equipped with its own drive 16. The workpieces are supplied by the carousel 11 to respective chambers 14 assigned on the two great circles K. In most cases, the chambers 14 are provided only along one great circle K, with the corresponding configuration of the carousel 11 and the drives 16.

It is definitely within the contemplation of the present invention to provide on the chamber shown in FIG. 1 treatment chambers 14 along several great circles K, but to configure the carousel 11 such that workpieces 5 are arranged only along a single great circle K but to then displace the carousel 11 back and forth also axially, i.e., in the direction of the axis A, in order to, for example, guide the workpieces first past the treatment chambers 14 along one great circle K and then past the treatment chambers 14 along a second great circle K. Also, the drives 16 according to FIG. 1 may be magnetically fluid-driven by electric motors, or pneumatically or hydraulically driven, preferably pneumatically.

With respect to a preferred construction of the bordering surfaces of the openings 3 and of the bordering surfaces of the workpiece carriers (not shown) for the workpieces 5, reference is made to FIGS. 7 to 9 and 10 to 13 and the following description. This construction permits the smallest possible stroke movements of the slides 18, if they are to be provided at all.

Figure 2:
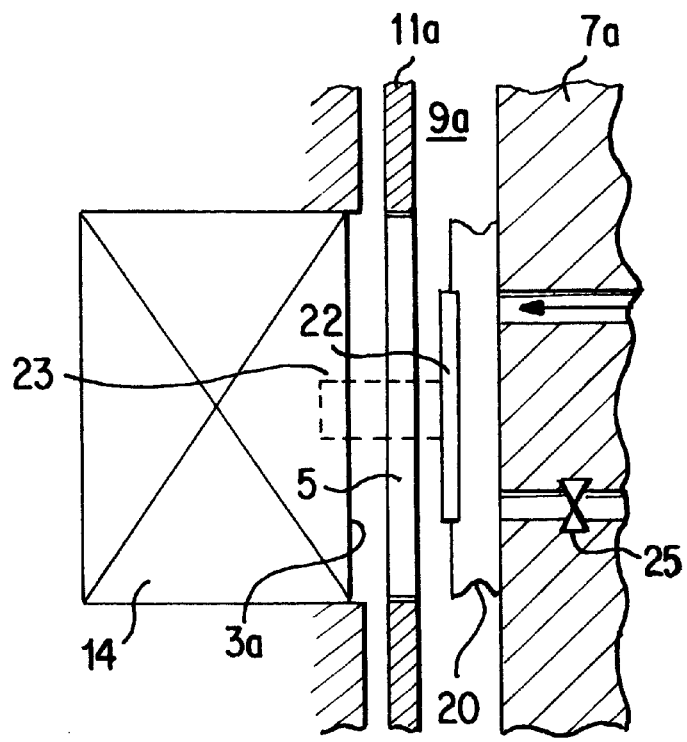
FIG. 2 is an enlarged view of a fluid-driven, preferably pneumatically or hydraulically, driver arrangement of the drier area of the system showed in FIG. 1.

A preferred embodiment of such a drive 16 shown schematically in FIG. 1 is further schematically illustrated in FIG. 2 on an enlarged scale. It must be stressed that such a drive, that is, generally such a fluid-controlled, particularly pneumatic or hydraulic seal control, can also be used on vacuum treatment equipment of a type different from that illustrated in FIG. 1, specifically wherever it is endeavored to guide a workpiece to the opening of a treatment chamber and, in the process seal off the latter to the required extent. For reasons specific to a vacuum, a pneumatic drive is currently preferred.

With respect to the preferred combination, i.e., minimal stroke and active, fluid-controlled seal, reference is again made to the following constructions of FIGS. 7 to 13. On a wall, preferably a stationary housing wall 7a which, on one side defines a conveying space 9a, or optionally on an also movable conveying element, for example, for the servicing of several treatment chamber openings 3a, tight bellows 20 are provided, preferably with a stabilizing part 22 or an engaging part 23, as illustrated by a broken line (FIG. 2).

The admission of pressure to the bellows volume and its expansion lifts the workpiece 5 by a conveying arrangement 11a, as by the carousel 11 of FIG. 1, against the opening 3a and thus achieves a required sealing of the process space of the treatment chamber 14 from the conveying chamber 9a. By removing the pressure, for example, by an outlet valve 25, from the bellows space, the optionally spring-tensioned bellows are taken back with the workpiece 5. A sealing arrangement in the opening area 3a of the treatment chamber 14 is therefore implemented which can be operated or controlled by fluid, particularly pneumatically or hydraulically.

FIG. 1 clearly shows that, as the result of the construction of the drives 16, as schematically illustrated in FIG. 2, an extremely small size is obtained. The arrangement of the drives according to FIG. 2 in a modular manner on the inner cylinder 7 is also clearly shown in FIG. 1 to make it possible to construct the inner cylinder 7 as small as possible, because virtually no stroke lengths must be accommodated in the inner cylinder 7. This is particularly true if the principle is observed which will be explained by reference to FIGS. 10 to 13.

Figure 3:
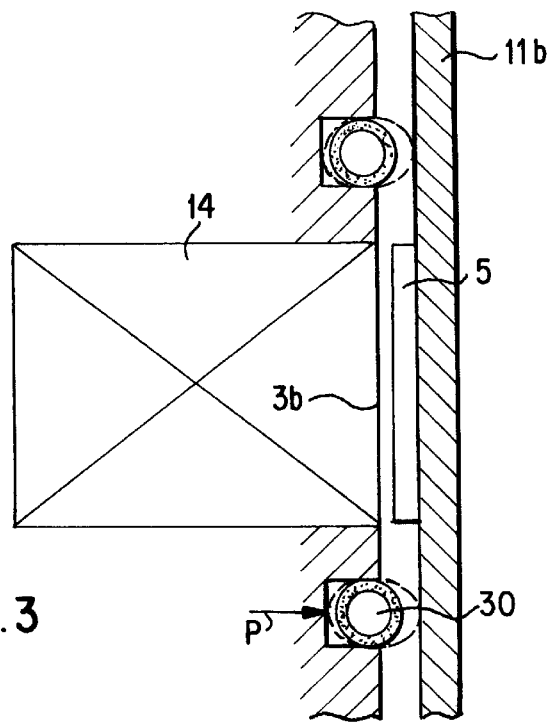
FIG. 3 is an enlarged schematic view of a sealing arrangement in the opening area of a treatment chamber according to a second embodiment of the present invention.

FIG. 3 is a schematic view of another embodiment of a hydraulically preferably pneumatically controlled sealing arrangement. Around the opening area 3b of a treatment chamber 14, an elastic hose 30 or an elastic bellows is arranged and acted upon by pressure in a controlled manner, as indicated at arrow p. In this embodiment, the hose 30 expands within the range of its inherent elasticity and is sealingly placed on the conveying arrangement 11b for the workpiece 5 or, if permissible, directly against the workpiece 5 (not shown). The workpiece 5 does not have to the displaced with respect to the conveying arrangement 11b in the direction of or away from the opening 3b, which is particularly true if, in the case of a rotary conveying device, the principle is observed which is explained by FIGS. 10 to 13.

Figure 4:
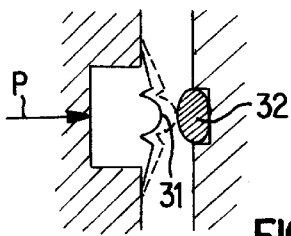
FIG. 4 is a schematic view of a preferred embodiment of the seal shown in FIG. 3.

The elastic hose or bellows arrangement 30 illustrated in FIG. 3 may be replaced by the arrangement schematically illustrated in FIG. 4, where the elastic hose or bellows 30 is replaced by metallic bellows 31 which may be coated with an elastomer. The metallic bellows 31, which may be coated on the outside by an elastomer, when acted upon by pressure (again schematically shown by an arrow p), is preferably pressed onto an O-ring arrangement 32. It is not absolutely necessary, however, to provide this O-ring arrangement.

The controlled sealing arrangement illustrated in FIG. 4 can be subjected to higher temperature-caused stress than the arrangement illustrated in FIG. 3, in that the elasticity values of the metallic membrane or of the metallic bellows 31 remain essentially constant in significantly wider temperature ranges in comparison to those of the elastic hoses or bellows 30 made of a plastic material. Thus, the arrangement according to FIG. 4 is used predominantly in thermally higher stressed ranges.

Figure 5:
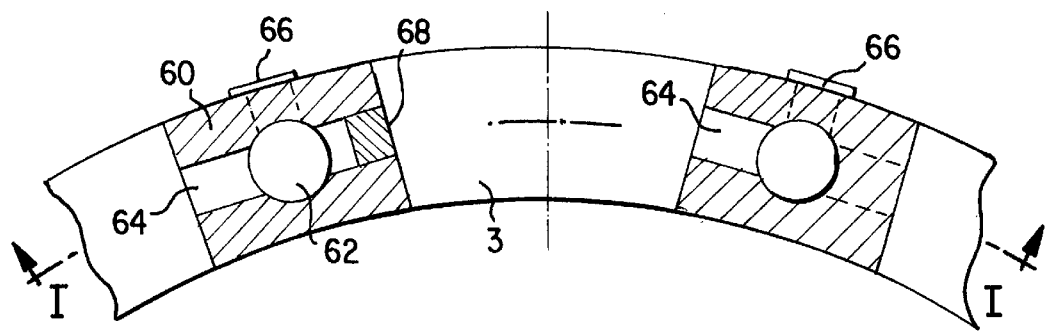
FIG. 5 is a schematic top view of an outer housing cutout of a vacuum treatment system.

The schematic cutout of the outer wall or of the outer housing 1 of a vacuum treatment system of the invention according to the third aspect of the present invention shown in FIG. 5 comprises openings 3 for mounting the above-described treatment chambers. In-between, in the direction of surface lines of the cylinder, conductors and bores 62 are worked into the wall of the housing 60 and communicate by way of connecting pipes 64 with respective adjacent wall parts which form the openings 3. They can be connected from the outside by another connecting pipe 66. Of course, the conductors 62 are closed on the top and bottom and can be closed, for example, by threaded bolts, or the connecting pipes 66 are placed on the bores 62 directly at the top or the bottom.

Furthermore, as schematically illustrated at reference numeral 68, the connecting pipes 64 can also be optionally closed, as, for example, by studs. Thereby, a high flexibility is achieved in order to use the thus implemented distributing system 62, 64, 66 for pumping down or flooding the treatment chambers connected to the openings 3 or optionally admit gas thereto.

As the result of the conductor arrangement according to FIG. 5, high line conductances are achieved in that only very short distances can be implemented with the largest possible conductor cross-sections between external connecting pipes and openings 3 provided for treatment chambers.

Figure 6:
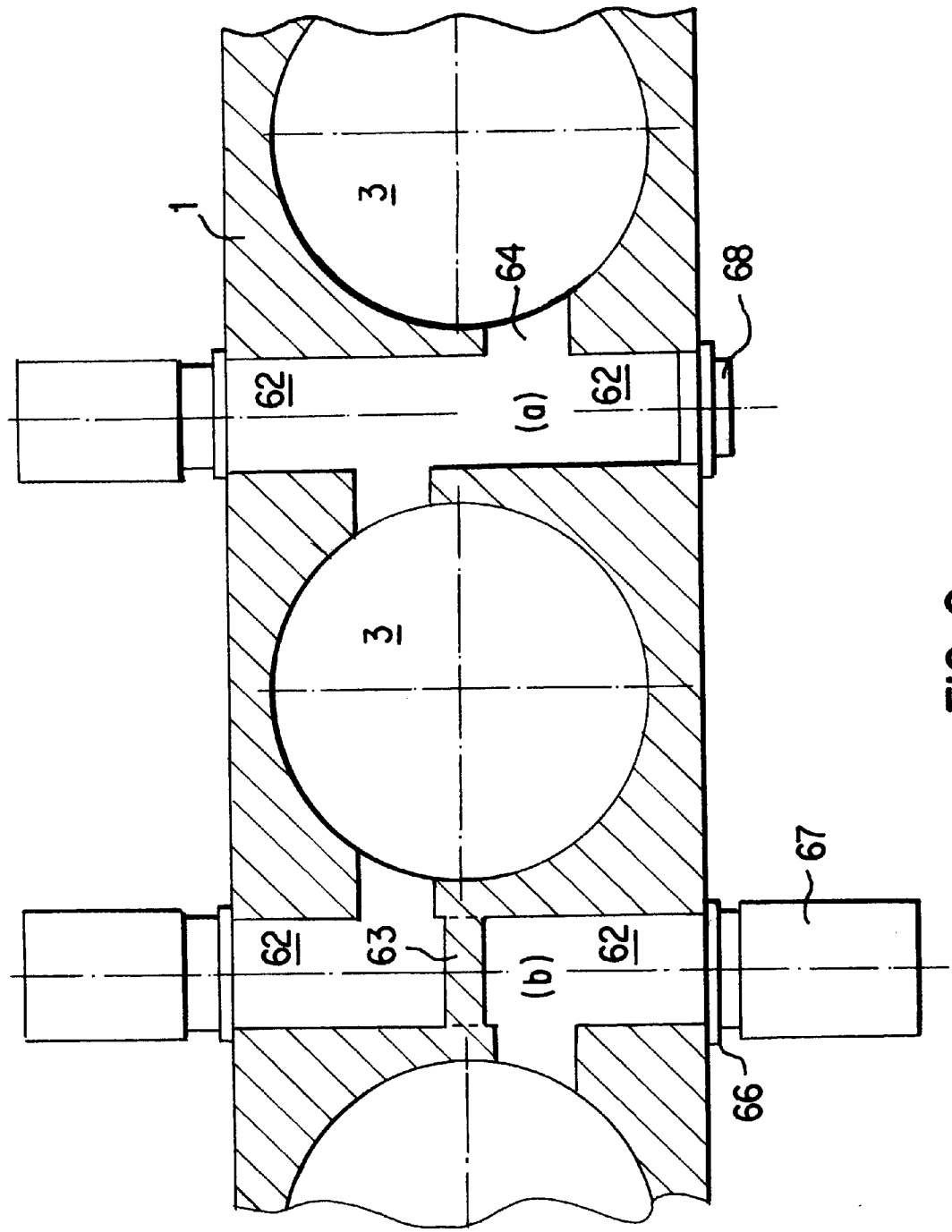
FIG. 6 is a cross-sectional view of a portion of the outer housing of the system along line I—I FIG. 5.

FIG. 6 is a sectional view along to Line I—I of FIG. 5 of a preferred embodiment of the outer housing 1. The same reference numerals are used as in FIG. 5. The connecting pipes 66 are provided directly on the face of the conductors 62. The conductors 62 extend through the expansion of the outer housing wall 1, as illustrated at (a) or, as illustrated at (b), are constructed as pocket bores or can optionally be separated by a separating bolt 63 which can, for example, be screwed in. Assemblies, preferably turbine vacuum pumps 67 or closing covers 68, are flanged directly to the connecting pipes 66. The illustrated configuration results in a very high flexibility for connecting external assemblies, particularly the above-mentioned turbine vacuum pumps 67 but also valves and/or additional pumps.

The housing 1 can have a massive, preferably one-piece construction, preferably consisting of aluminum or an aluminum alloy. The inner housing 7 shown in FIG. 1 is preferably also constructed of such metals and preferably also has a massive, preferably one-piece construction.

Figure 7:
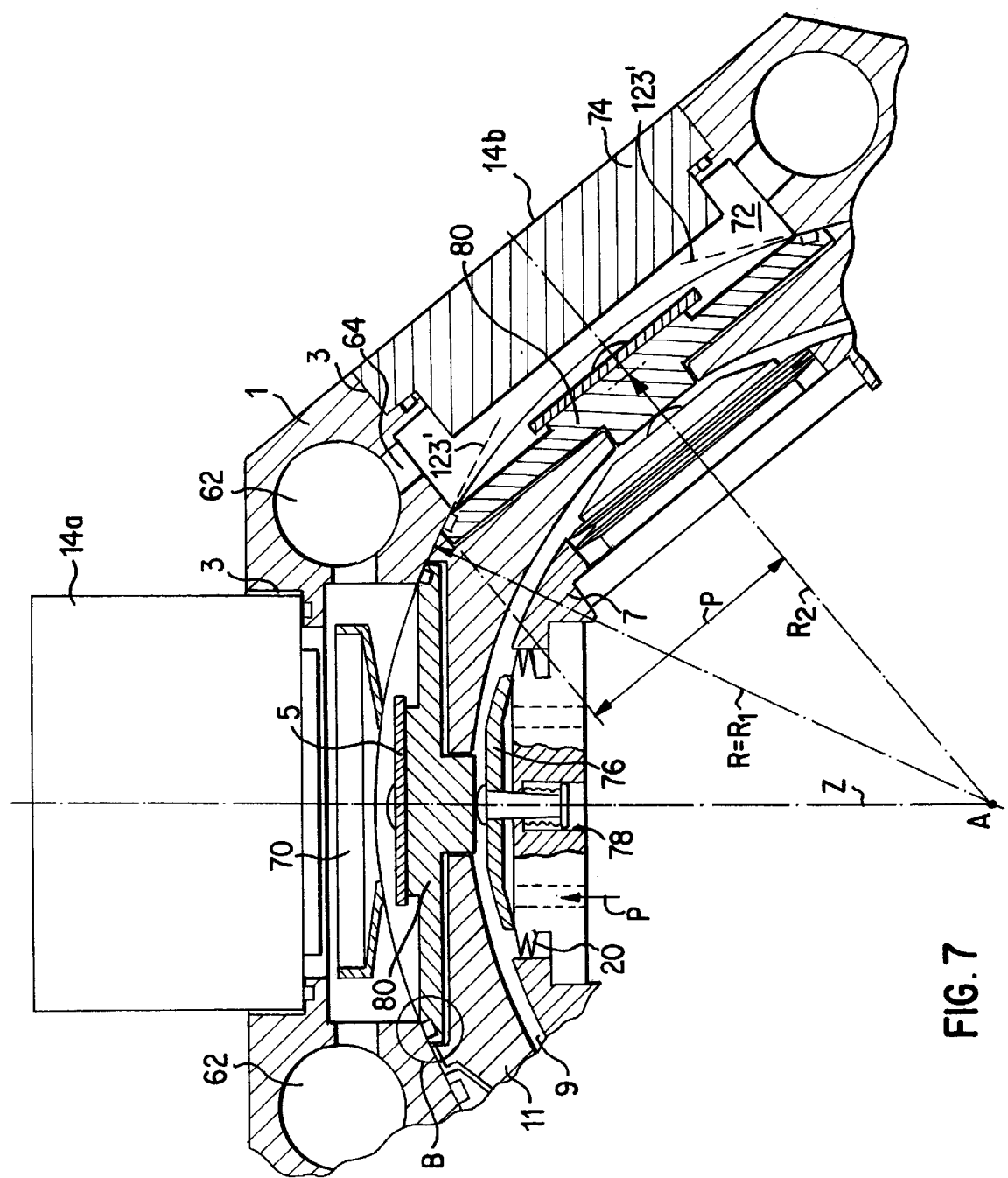
FIG. 7 is a simplified cross-sectional cutout of a preferred embodiment of a system according to the present invention.

FIG. 7 is a simplified view of a portion of a cross-section of a currently preferred embodiment of a treatment system according to the invention, having a separate drive for each driving device, a pneumatic sealing control, and an optimal utilization of the wall for conductor systems.

Wherever possible and for facilitating a cross reference, reference numerals which have already been used are used for identical elements and assemblies described below.

The outer housing 1 has openings 3 for accommodating processing stations, such as a coating station 14a and a lock station 14b. In the corner areas between the openings 3, the bores 62 are worked into the wall of the outer housing 1, with the connecting pipes 64 to the respective adjoining openings 3. The wall thickness of the outer housing 1 is dimensioned such that the processing space 70 of a plasma coating or etching chamber 14a is bounded by the outer housing wall or the lock space 72 of a lock station 14b with an outer lock valve 74. Opposite the openings 3, the inner housing 7 has slide devices which can be operated in the manner illustrated in FIG. 2, on which the admission of pressure to a bellows space causes the lifting of a driving device 76 against the restoring force of a tension spring 78.

In the ring-shaped conveying space 9 formed by the inner and outer housing, the carousel 11 is arranged in a rotationally driven manner, with inserted workpiece carriers 80 for the workpiece disks 5. The size of the workpiece carriers 80 is designated by ρ. By lifting the workpiece carriers 80 by activating the pneumatic slide drives 20, 76, a sealing takes place to the desired extent in the encircled area marked B which surrounds the opening 3. As illustrated at the lock station 14b, the workpiece carrier plate 80 forms the internal lock valve. Because of the preferred construction of the bordering surfaces of the openings 3 and of the workpiece carriers 80, only slight stroke movements of the slide drives 20. 76 are required. In addition, in area B, active, fluid-controlled seals can be provided, preferably as illustrated in FIG. 4.

Figure 8:
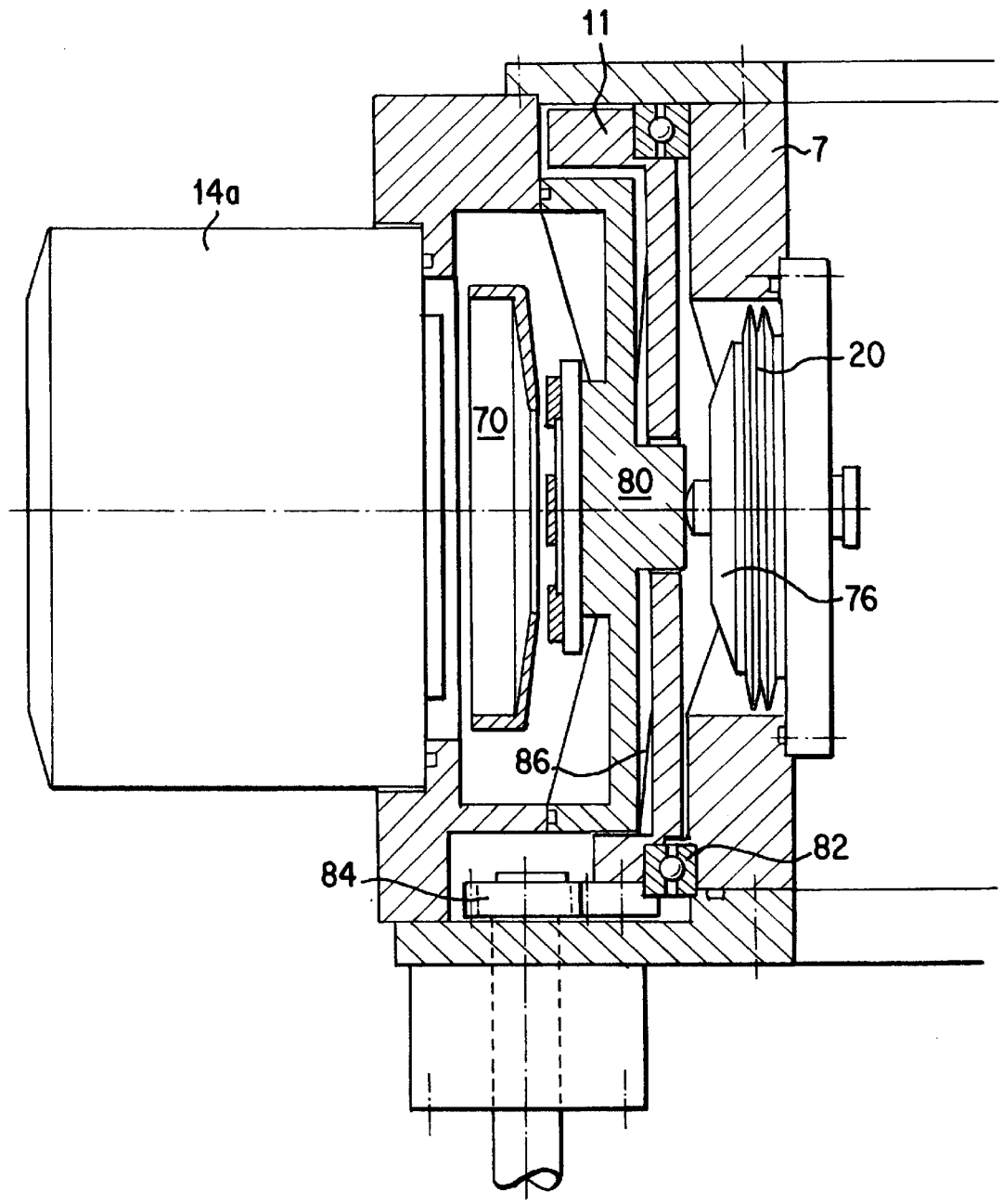
FIG. 8 is a longitudinal sectional view of a portion of a preferred embodiment of the system according to the present invention.

FIG. 8 is a more detailed longitudinal sectional view along the axis A of FIG. 7 and through a treatment station, particularly a coating station 14a (not shown as a sectional view). The same reference numbers are again used wherever appropriate for previously described devices. In addition to the description of FIG. 7, reference is made to the bearing 82 of the carousel 11 as well as to its drive at reference numeral 84. Furthermore, FIG. 8 more clearly shows restoring springs 86 which, for example and preferably constructed as leaf springs, also take back the workpiece carrier 80, when the bellows 20 are relieved and restored, with the driving device 76.

Figure 9:
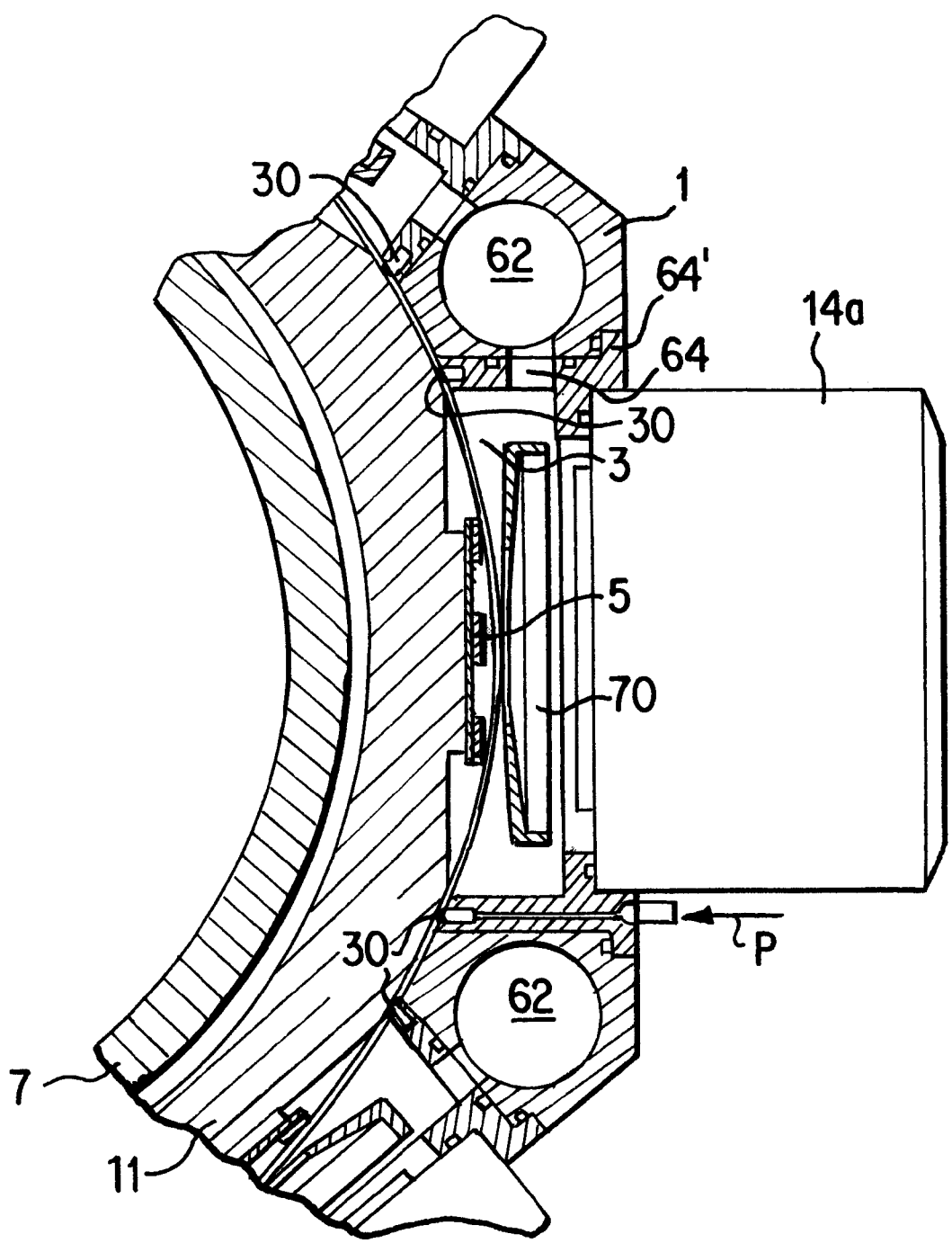
FIG. 9 is a cross-sectional view of another currently preferred embodiment of a portion of a system of the invention according to FIG. 8.

FIG. 9 is a sectional view perpendicularly to the axis A of FIG. 7 of another currently preferred embodiment, in which no radial lifting movement is exercised on the workpieces 5. The same reference numerals are again used for the previously described devices. Reference is made particularly to the elastic sealing bellows 30 which act between the borders of the openings 3 and the carousel 11. As mentioned above, such surrounding sealing bellows 30 or, according to FIG. 4, metallic sealing membranes 31 can definitely also act directly upon the workpieces 5 if permissible in the case of the respective workpieces 5 and the corresponding surface treatment thereof. The configuration of the bordering surfaces of the openings 3 and of the workpiece carrier in the areas at reference numeral 30 according to the principle to be explained, particularly according to FIGS. 10 to 13, for avoiding the stroke, is particularly clearly demonstrated.

The system shown so far, in addition to advantages to be explained below, has the following advantages:

(a) optimal utilization of the outer housing for guiding the conductors to treatment chambers and thus a highly compact construction; and (b) free accessibility from the interior Z of the inner housing to the control elements and control drives.

FIGS. 7, 8 and 9 show a vacuum treatment system according to the present invention which, according to another important aspect, has an extremely advantageous construction as explained by reference to FIGS. 10 and 11.

Figure 10:
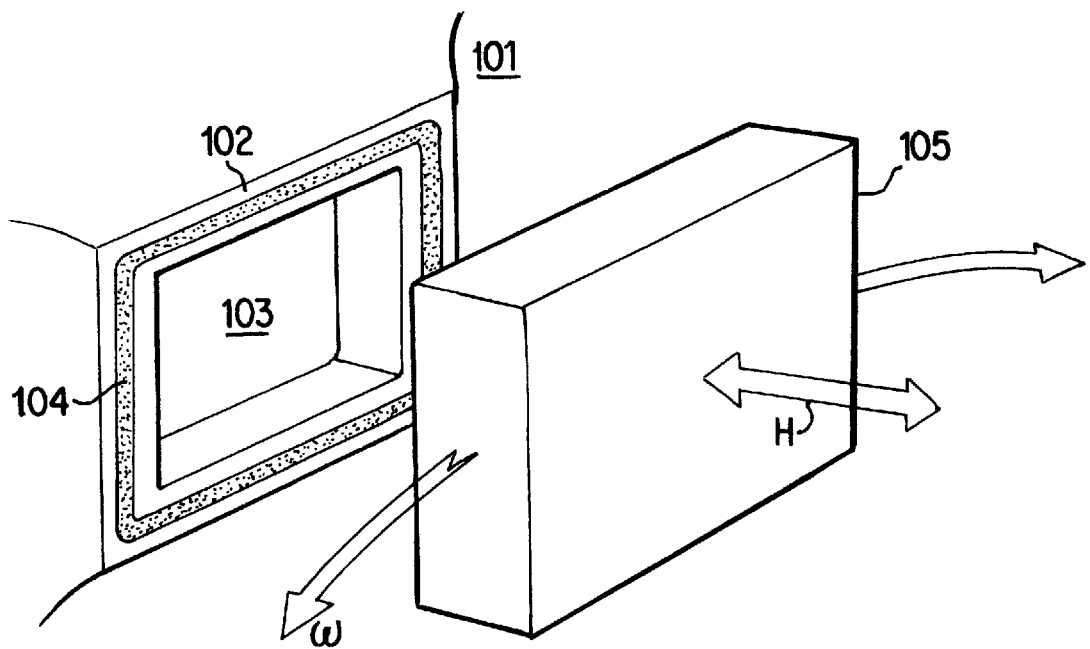
FIG. 10 is a perspective view of the conditions between a plane workpiece carrier and the cylindrical bordering surface of an opening of a known type to be serviced by the workpiece carrier.
Figure 18:
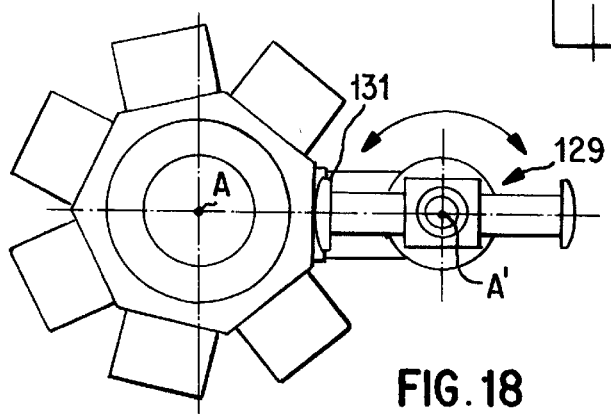
FIG. 18 is a plan view of an opening bordering surface and a workpiece carrier shaping outside the chamber on the system shown in FIG. 17.

FIG. 10 illustrates a plane bordering surface 102 of a conveying-through or treatment opening 103 for at least one workpiece in the chamber wall 101, with the seal 104. Reference numeral 105 indicates a workpiece carrier which (as best seen in FIG. 11) is disposed in a rotationally driven manner movable about the axis A and inside or (as seen in FIG. 18, A') outside the chamber. The workpiece carrier 105 is also displaceable with respect to the axis A in a radially driven manner in the direction of the arrow H. To continue, the rotation of the workpiece carrier 105, it must be lifted by at least $H_{min}$ off the surface 102.

Figure 11:
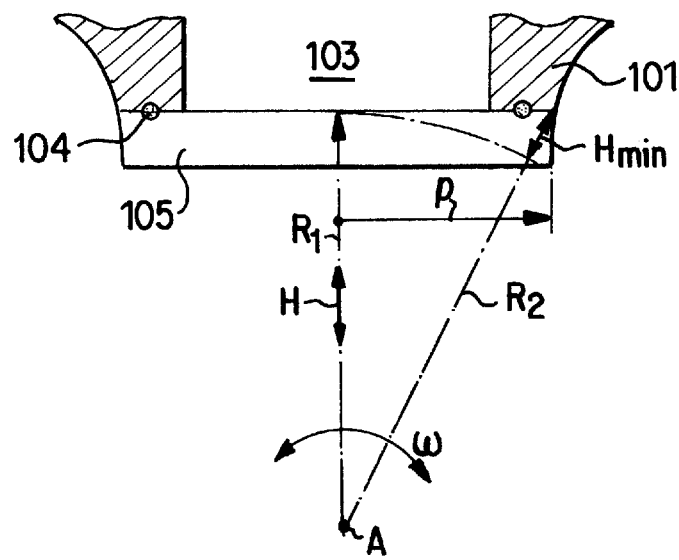
FIG. 11 is a top schematic view for explaining the required lift-off stroke of the conditions shown in FIG. 10.

The following discussion applies to FIG. 11 and FIG. 7. In practice, a stroke value ΔH, which is a function of the sealing system, tolerances and safety distances, etc., is added to $H_{min}$. If the radius $R_2$ of a cylinder chamber with the axis A is, for example, 150 mm and ρ of the workpiece carrier is, for example, 70 mm, $H_{min}$ is 17 mm, to which ΔH of, for example, 10 mm is added.

As illustrated particularly in FIG. 11, this known and conventional approach has the result that the plane workpiece carrier 105 must be taken back by a relatively large stroke extent H. Thereby, as the result of a rotating movement, it can subsequently be swivelled about the axis A to another of the above-mentioned openings of the wall 101. According to another aspect of the present invention, which can be combined with all above-mentioned and described characteristics of the system, the disadvantage of the convention approach is eliminated by the systems illustrated in FIGS. 7 to 9 which will be described below.

The basic solution of this problem will first be illustrated by reference to FIGS. 12 and 13 in a manner similar to the above discussion of FIGS. 10 and 11. The bordering surface 102' of the opening 103 is now a cutout of a rotation body shell surface with the axis A, as illustrated, for example, of a cylinder surface. Likewise, the bordering surface of the workpiece carrier 105' is a cutout of the same rotation body shell surface.

Figure 13:
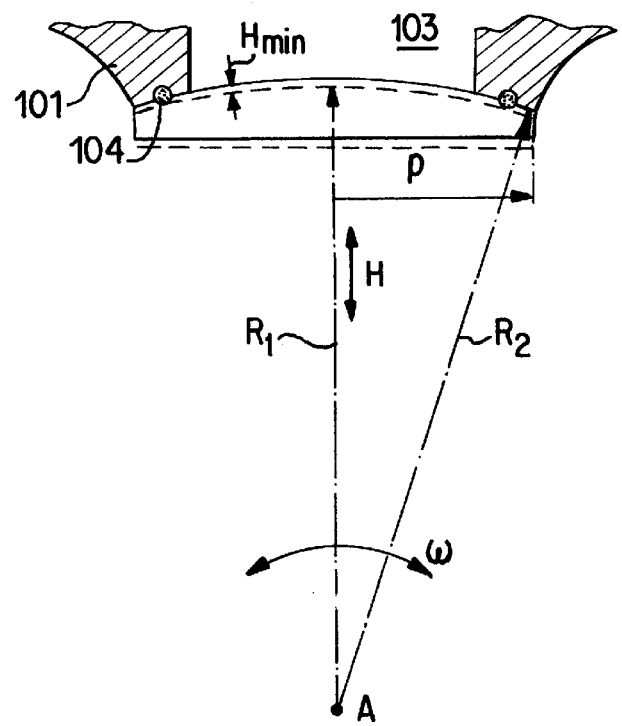
FIG. 13 is a view of the consequences resulting form the condition shown in FIG. 12 with respect to the lift-off stroke.

As illustrated in FIG. 13, and also in FIG. 11, $$R_2 = R_1$$

and, independently of p, the following applies $$H_{min} = R_2 - R_1 = 0.$$

Figure 12:
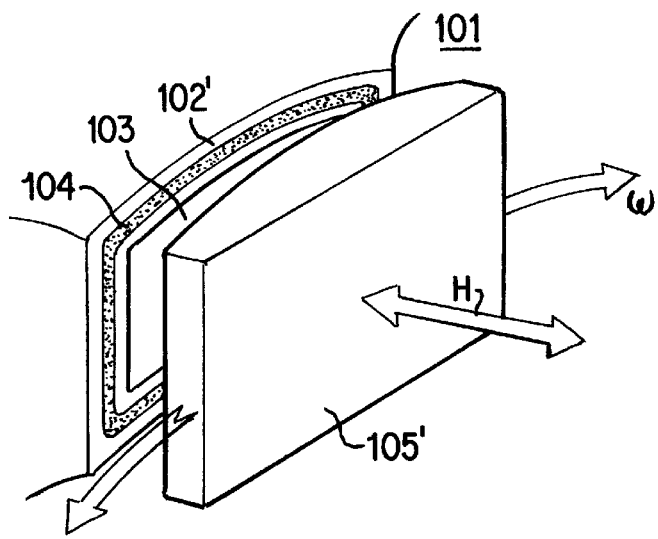
FIG. 12 is a schematic view similar to FIG. 10 showing the conditions in shaping of the opening bordering and the workpiece carrier bordering according to the invention.

ΔH remains as a required stroke which, however, according to FIGS. 11 and 12, is much lower and therefore can be sized to be even lower because the stroke per se and play coupled therewith, as well as tolerances, etc. are reduced. The considerations on the basis of FIGS. 12 and 13 which, of course, also apply when not only the surface framing the respective opening defines the surface of a rotation body but the entire chamber wall 101 essentially defines a rotation body surface.

The vacuum treatment system according to the above-described figures, particularly FIGS. 7 to 9, is implemented according to the description immediately above. The cross-sectional views of FIGS. 7 and 9 and the longitudinal sectional view of FIG. 8 show that the workpiece carriers 80 in the area marked B in FIG. 7, as well as the bordering surface of the opening 3, are constructed at least in a first approximation corresponding to a cylinder shell cutout surface. Thereby, the slightest stroke movement radially with respect to the axis A permits the workpiece carriers 80 to be lifted off and swivelled further.

In the embodiment according to FIG. 9, stroke movements are completely eliminated. The active seals sealingly bridge the gap between the workpiece carrier (carousel) and the bordering of the opening. The opening bordering surface is preferably molded to an exchangeable flange 64' which can be easily handled during the production phase.

Figure 14:
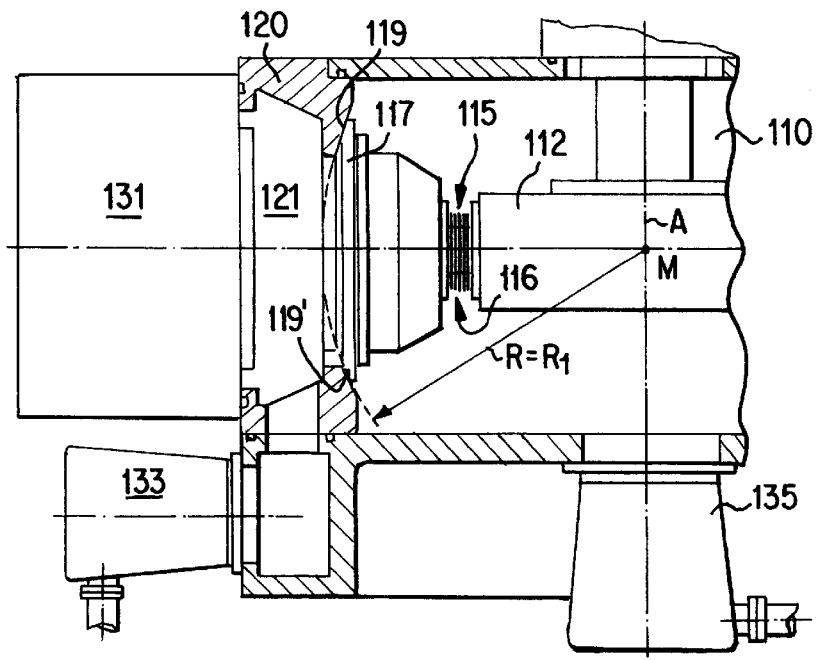
FIG. 14 is a longitudinal sectional view of a system according to the invention with a ball-race-shaped chamber wall.
Figure 15:
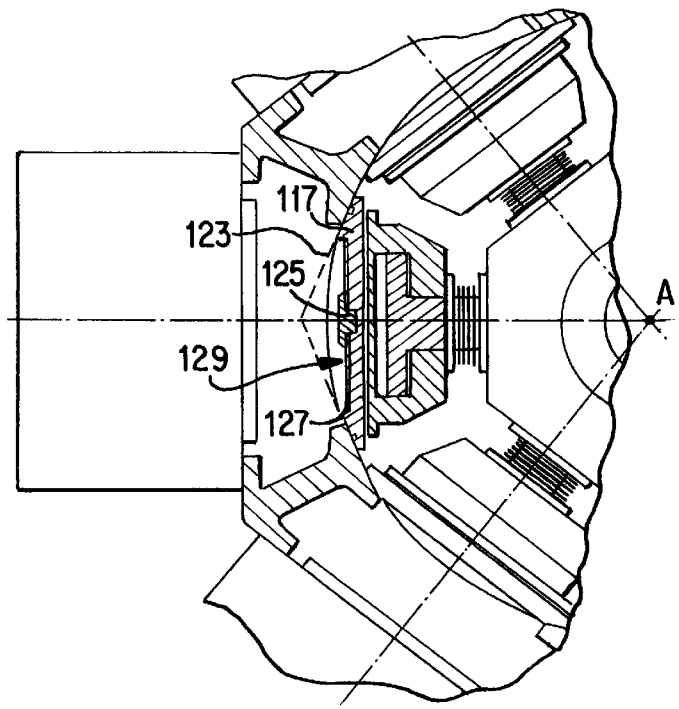
FIG. 15 is a cross-sectional view of the system shown in to FIG. 14.

The longitudinal sectional view of FIG. 14 and the cross-sectional view of FIG. 15 show a chamber 110 which, with respect to the axis A or the center point M, determines a spherical surface ring with a ball radius $R=R_1$. The conveying device 112, which is rotatably driven with respect to the axis A, has several, in the illustrated embodiment four, radially acting slides 115, each with an encapsulated drive 116. The drives are preferably independent of one another. The workpiece carriers 117, which are provided in the end position on the slides 115, have in their edge area 119 at least approximately the shape of a cutout ring of a spherical surface with the radius R. As a result, they can be placed closely onto the bordering surface of the respective opening 121, also constructed as a cutout ring of a spherical surface with the radius R.

The bordering surfaces of the workpiece carriers 117 either, as mentioned above, have a spherical surface ring shape or, approximately, as illustrated in FIG. 15 at reference numeral 123, are constructed in the form of a tapered ring, cut out of a tangent cone at the spherical surface rings extending through the opening bordering surface. The latter may also be constructed approximately as a conical surface ring of a cone, as illustrated by dashed lines designated by reference numeral 123. As particularly illustrated in FIG. 15, the bordering surface of the workpiece carriers 117, for receiving circular-disk-shaped workpieces, is held by a center masking, formed by a periphery masking ring 127 for the workpieces 129. In addition, FIGS. 14 and 15 show a treatment station, such as a sputtering station 131 on one of the openings 121. Also shown are a pump 133 for the sputtering station 131 and a pump 135 for the chamber 110 constructed as a conveying chamber.

The bordering surface of the opening, in turn, is preferably worked into a separate flange 120. Here also, the seals 119' may optionally be configured as active seals which are hydraulically or preferably pneumatically controllable.

Figure 16:
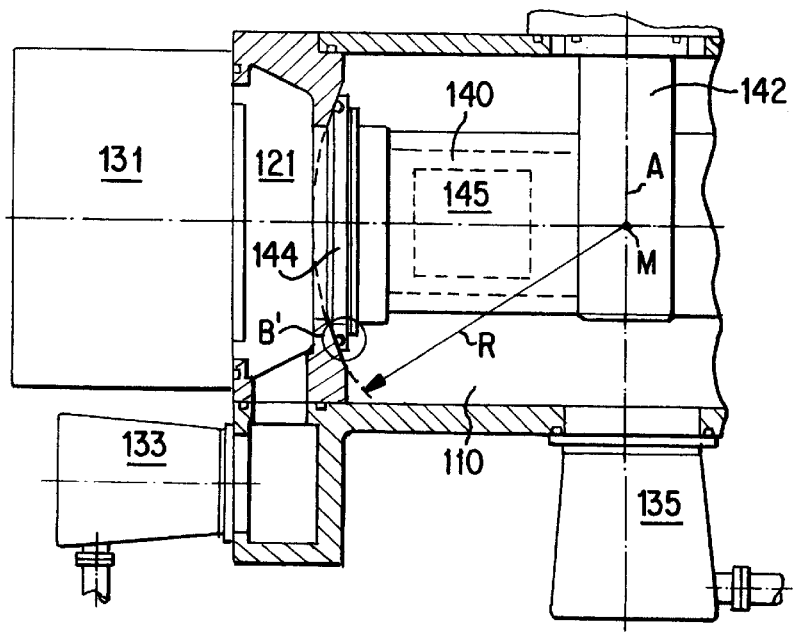
FIG. 16 is a view similar to FIG. 14 of a system invention having active seals according to the invention.

In the system shown in FIG. 16, carrier arms 140 on a rotary conveying device 142 in the ball race chamber 110 according to FIG. 14 carry workpiece carriers 144 in the end position. The arms cannot be radially moved out but are only rotatably driven about the axis A. Analogously to FIG. 9, the seals are constructed in the area B' as gap-bridging active seals, configured for example, in the manner shown in FIG. 4.

Because no stroke must be implemented at the arms 140 which are constructed as hollow tubes, assemblies can be guided or arranged in these arms 140, such as the workpiece carrier drives (for example, when diaphragm seals are provided, in the area B'), as well as measuring units for measuring, for example, the temperature at the workpiece, control members for heating for cooling, for example, the workpiece, electric and/or heating/cooling medium pipes, etc., as schematically illustrated in FIG. 16 by reference numeral 145.

Because of the stroke minimization implemented according to the present invention, stroke take-back movements H are permitted, without the use of active seals, in order to be able to continue the rotation of the conveying device 112 in the plane shown in FIG. 15 or to be able to continue the rotation of the carousel 11 of FIG. 7 which, with respect to the radius R of the rotation body surface, which is defined by the workpiece carrier during its rotation about the axis, correspond to the following relationships:

$r \leq 15\% R$, or preferably $r \leq 10\% R$, preferably even $r \leq 5\% R$.

Thus, with a radius $R=R_1$ in FIG. 14 of approximately 145 mm, a lift-off stroke of less than 20 mm, preferably of less than 12 mm, or even of less than 8 mm is permitted.

As a result, it is possible to convey workpiece carriers of large dimensions p inside small-diameter (R, $R_1$) chambers by a rotation about a chamber axis (A), with extremely small, if any at all, stroke movements. The stroke movement (ΔH) becomes independent of the workpiece carrier size ρ. Without a definable lower limit, the stroke is preferably designed at no more than 20% ρ, preferably no more than 10% ρ or even no more than 5% [p] ρ. When active seals or a diaphragm seal are/is provided, stroke movement can be eliminated completely.

At least the chamber wall surfaces framing the openings in this case define at least in a first approximation, cylinder surfaces or spherical surfaces, in the above-mentioned sense, approximated optionally by approximation surfaces, as illustrated in FIG. 7 at reference numeral 123' or in FIG. 15 at reference numeral 123. Correspondingly, the bordering surfaces of the workpiece carriers, as illustrated particularly by the periphery masking ring 127 in FIG. 15, define spherical surface rings or, according to FIGS. 7 to 9, cylinder surface cutouts, again precisely or by approximation surfaces, as also illustrated at reference numerals 123' and 123.

In the carousel system of FIG. 7, the radial slides may be fixedly aligned with the openings or also rotationally movably driven with respect to the axis A.

In comparison to systems which are conventional with respect to the shaping of the bordering surfaces of the openings and the bordering surfaces of the workpiece carriers, the present invention makes it possible to reduce the necessary release stroke for the workpiece carrier to less than 25%. Because of the now minimal required strokes, shorter cycle times are permitted which, in turn, results in an increase of the throughput on such a system.

Figure 17:
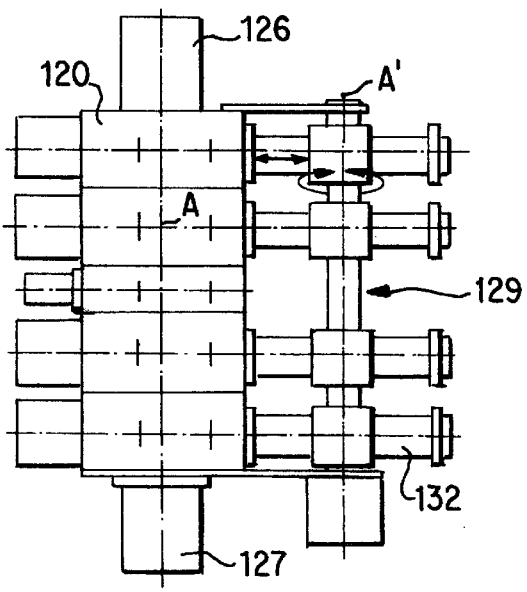
FIG. 17 is a side view of several of the chambers of the invention shown in FIGS. 14 and 15, or preferably stacked in a modular manner.

As illustrated in FIG. 17, because of their compactness, several vacuum chambers 121 according to the invention can be stacked in a modular manner and can be driven or serviced, for example, by a common driving motor 126, a common pump 127 and a common handling-robot arrangement 129.

It is to be understood that the principle with respect to the shaping of the bordering of the opening and the shaping of the bordering of the workpiece carrier, with a reference to FIG. 18, can also be implemented on an outer surface of a vacuum chamber with respect to the workpiece carriers 131 of a handling robot 129 situated on the outside, by slides according to FIGS. 14, 15 or preferably, by carrier arms 140 according to FIG. 16.

In addition to the above-mentioned advantages, the system according to the present invention therefore has the following advantages:

(i) Few moving parts with short movement strokes which significantly increases the reliability and the ease of servicing;

(ii) High economic efficiency with respect to the manufacturing of the system;

(iii) High throughput because of short paths to be covered by the workpieces and small masses to be moved;

(iv) Extreme suitability for a multilayer system application because the treatment chambers can be mutually closed off according to the desired extent;

(v) Wear-resistant, individually adjustably controlled seals at the processing stations;

(vi) individually time-controllable and stroke-controllable slide drives;

(vii) Extremely compact construction.

For the treatment of circular-disk-shaped workpieces, a ball-bearing-shaped chamber according to FIGS. 14 to 16 is currently preferred.

An end-position workpiece carrier constructed in accordance with the present invention can to be in the form of several workpieces receiving devices configured as planets of an end-position planetary gear.

One or more workpiece carriers can be configured to receive a circular disk-shaped workpiece, and include a center masking pin for a center hole of the workpiece. The carriers are provided with a bordering surface defined by a peripheral masking ring for the received workpiece. The masking ring defines a tapered-ring-shaped bordering surface of the workpiece carriers.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A vacuum treatment system, comprising:
an outer housing which defines a substantially cylindrical inner wall around an axis;
at least two openings for treating or conveying-through a respective workpiece arranged along at least one great circle of the substantially cylindrical inner wall;
one treatment, conveying or lock chamber respectively, operatively connected with the at least two openings;
an inner housing which defines an essentially cylindrical outer wall and, together with the substantially cylindrical inner wall, forms a substantially cylindrical ring gap,
a workpiece carrier carousel rotationally drivable about the axis in the ring gap and having at least two workpiece supports; and
a feed device comprising driving devices movable in a radially drivable manner on the inner housing and aligned with the at least two openings, wherein the driving devices act into the ring gap and on respective ones of workpieces on said at least two workpiece supports brought in alignment with said openings by rotation of said carousel and each of said driving devices having a separate drive operable independently from the other separate drives has a separate drive.

2. The system according to claim 1, wherein the treatment chamber is a plasma surface treatment chamber, comprising an atomization chamber having a magnetron source.

3. The vacuum treatment system according to claim 1, wherein each of the drives is fluid-driven, and the driving devices comprise bellows-encapsulated drivers with a bellows which interior acts as a pressure driving space.

4. The system according to claim 3, wherein the driver devices are configured by at least one elastic bellows arrangement, respectively, arranged to be pressure actuable.

5. The system according to claim 1, wherein the driving devices are arranged to act directly onto a respective workpiece on a carousel or on a receiving plate disposed on the carousel for the workpiece.

6. System according to claim 5, wherein, in an area of at least one of the openings, a sealing arrangement is arranged which establishes a sealing between at least one of an opening border area and the workpiece and between the opening border area and the workpiece receiving device on the carousel, controlled by movement of the driver devices.

7. The system according to claim 5, wherein a lock chamber is mounted to one of said at least two openings and said receiving plate constitutes a lock of said lock chamber.

8. The system according to claim 1, at least one of said at least two openings communicating with a lock chamber or a vacuum treatment chamber and wherein the wall of the outer housing around said at least one opening constitutes the wall of said lock chamber or vacuum treatment chamber.

9. The system according to claim 1, wherein the openings are arranged along several great circles, and the carousel is axially movably arranged along a corresponding number of the great circles.

10. The system according to claim 1, wherein said workpiece receiving devices have the shape of a workpiece recipient and have a ring surface corresponding to a cylinder surface cutout.

11. A vacuum treatment system comprising:
  an outer housing which defines a substantially cylindrical inner wall around an axis;
  at least two openings for treating or conveying-through a respective workpiece arranged along at least one great circle of the substantially cylindrical inner wall;
  one treatment, conveying or lock chamber respectively, operatively connected to each of said at least two openings; and
  a feed device with workpiece receiving devices alignable with the at least two openings,
  wherein a fluid-controlled sealing arrangement is operatively connected with at least one of the at least two openings, for establishing a sealing extending around the at least one of the openings and releasing the sealing between the opening border and one of the workpiece receiving devices or the workpiece.

12. The system according to claim 11, further comprising:
  an inner housing which defines an essentially cylindrical outer wall and which forms, together with the substantially cylindrical inner wall, a substantially cylindrical ring gap, said feed device with workpiece receiving devices being formed by
  a workpiece carrier carousel rotationally drivable along said ring gap.

13. The system according to claim 11, wherein a fluid-controlled, expandable elastic seal is operatively arranged around at least one of the openings such that, when pressure actuated, the elastic seal is tightly held against a workpiece receiving device or the workpiece directly.

14. The system according to claim 13, wherein said workpiece receiving device or said workpiece is not movable towards or from said at least one of said openings.

15. The system according to claim 11, wherein at least one of the opening borders and a zone extending around a workpiece receiving device or the workpiece is configured as a controllable sealing device, with the sealing effected by a fluid-controlled tensioning device operatively arranged so that with admitted pressure, the workpiece receiving device or the workpiece is sealingly tensioned against the at least one of the opening borders.

16. A method for manufacturing multi-layer coated workpieces comprising
  providing a ring-shaped vacuum chamber,
  proving within said ring-shape vacuum chamber a workpiece carrier carousel rotationally drivable along said ring-shaped vacuum chamber,
  providing along said ring-shaped vacuum chamber vacuum coating stations,
  proving opposite to said vacuum coating stations driving devices at said ring-shaped chamber, each with a separate drive independently operable from the other separate drive,
  arranging workpieces on said workpiece carrier carousel,
  rotating by means of said carousel respective of said workpieces in alignment with said coating stations,
  individually moving said workpieces in alignment by means of said separate drives towards and from said chambers,
  applying layers to said workpiece in said respective chambers.

17. The method of claim 16, wherein said multi-layer coated workpieces are storage disks.

18. The method of claim 17, wherein said storage disks are one of optical storage disks, CDs, DVDs, Hds, recordable storage disks, phase change disks, recordable disks.

19. A conveying chamber for a vacuum treatment system having:
  an outer housing which defines a substantially cylindrical inner wall around an axis;
  at least two openings for treating or conveying-through a respective workpiece arranged along at least one great circle of the substantially cylindrical inner wall;
  one treatment, conveying or lock chamber respectively, operatively connected with the at least two openings;
  an inner housing which defines an essentially cylindrical outer wall and, together with the substantially cylindrical inner wall, forms a substantially cylindrical ring gap;
  a workpiece carrier carousel rotationally drivable about the axis in the ring gap; and
  a feed device comprising driving devices movable in a radially driven manner on the inner housing and aligned with the at least two openings, which driving devices act into the ring gap, wherein each of the driving devices has a separate drive, and the chamber comprises the outer housing, the at least two openings, the inner housing, a workpiece carrier carousel, and the feed device with the driving devices.

20. A vacuum chamber, comprising at least one opening for conveying-through or treatment of at least one workpiece, a conveying device rotationally movably drivable about an axis associated with the vacuum chamber, and at least one workpiece carrier, alignable by way of the conveying device with the at least one opening, wherein at least a bordering surface of the at least one opening, in at least a first approximation, is formed by a surface cutout of a rotation body about said axis and a bordering surface of the workpiece carrier is formed, in at least a first approximation, by a surface cutout of said rotation body as well, said bordering surfaces are mutually adjacent when said workpiece carrier is aligned with said at least one opening, and wherein said bordering surfaces form, as said at least one workpiece carrier is aligned with said at least one opening, a diaphragm seal or a sealing arena at which by controllably moving said bordering surface of said workpiece carrier towards said bordering surface of said at least one opening or by providing a controllable sealing member between said bordering surfaces a controllable seal is established.

21. The vacuum according to claim 20, wherein a fluid-controlled sealing arrangement is provided at least on the bordering surface of the at least one opening or of the workpiece carrier.

22. The vacuum chamber according to claim 21, wherein the sealing arrangement comprises at least one of a bellows-elastic and material-elastic sealing diaphragm.

23. The vacuum chamber according to claim 20, wherein at least one driver which, with respect to the axis, is radially drivably movable in at least one movement component and which acts upon the workpiece carrier, is operatively arranged to move the workpiece carrier, aligned with the at least one opening toward and away from the at least one opening.

24. The vacuum chamber according to claim 20, wherein the rotation body is one of a ball and a cylinder.

25. The vacuum chamber according to claim 20, wherein the conveying device operatively arranged inside the vacuum chamber.

26. The vacuum chamber according to claim 20, wherein the at least one driver is configured to radially carry out a stroke H which, with respect to the radius R of the rotation body, corresponds to the relationships $H \leq 15\%$ R, preferably $H \leq 10\%$ R, and more preferably $H \leq 5\%$ R.

27. The vacuum chamber according to claim 20, wherein the workpiece carrier, aligned to the at least one opening, by way of a bordering surface thereof, is displaceably arranged with respect to the bordering surface of the at least one opening and with respect to the axis radially by less than 20% P, preferably by less than 10% P, more preferably by less than 5% P, whereby 2 P is considered as a dimension of the workpiece carrier in the axial direction.

28. The vacuum chamber according to claim 20, wherein the conveying device is configured as a carousel having at least two of the workpiece carriers, at least two openings are provided.

29. The vacuum chamber according to claim 20, wherein at least two drivers are non-rotatably arranged with respect to the axis or at least one driver is rotationally disposed and driven with respect to the axis.

30. The vacuum chamber according to claim 29, wherein each driver is provided with an independent drive respectively.

31. The vacuum chamber according to claim 29, wherein the conveying device comprises at least one radial arm rotationally drivably disposed about the axis has an end-position workpiece carrier, and the radial arm constructed as a hollow body to form an assembly-receiving space.

32. The vacuum chamber according to claim 31, wherein the workpiece carrier comprises plural workpiece receiving devices constructed as planets of an end-position planetary gear.

33. The vacuum chamber according to claim 20, wherein a driver is disposed on the conveying device.

34. The vacuum chamber according to claim 33, wherein the conveying device and the driver are comprised by at least one arm which is disposed to be rotationally driven about the axis and radially movable in at least one moving component and which has an end-position workpiece carrier.

35. The vacuum chamber according to claim 20, wherein the at least one workpiece carrier is configured to receive a circular-disk-shaped workpiece and has a bordering surface formed by a periphery masking ring for the received workpiece.

36. The vacuum chamber according to claim 35, wherein the masking ring defines a tapered-ring-shaped bordering surface of the at least one workpiece carrier.

37. The vacuum chamber according to claim 35, wherein the at least one workpiece carrier comprises a center masking pin for a disk-shaped workpiece with a center hole.

38. The vacuum chamber according to claim 20, wherein the chamber is modular so as to be coaxially stackable and with one or more chambers, and has a common driving motor for the conveying devices and a common pump for the chambers.

39. The vacuum chamber according to claim 20, wherein the opening bordering and the workpiece carrier are sized to borderingly rest sealingly against one another.

40. The vacuum chamber according to claim 20, wherein the bordering surface of the at least one opening is an exchangeable flange.

41. A vacuum system comprising:

an outer housing which defines a substantially cylindrical inner wall around an axis;

at least two openings for treating or conveying-through a respective workpiece arranged along at least one great circle of the substantially cylindrical inner wall;

one treatment, conveying or lock chamber respectively, operatively connected with the at least two openings;

an inner housing which defines an essentially cylindrical outer wall and, together with the substantially cylindrical inner wall forms a substantially cylindrical ring gap;

a workpiece carrier carousel rotationally drivable rotationally about the axis in the ring gap; and a feed device comprising driving devices movable in a radially driven manner on the inner housing and aligned with the at least two openings, which driving devices act into the ring gap;

wherein each of the driving devices has a separate drive, and a vacuum chamber having at least one workpiece carrier, the workpiece carrier, by way of the conveying device being alignable with the at least one opening, wherein at least a bordering surface of the at least one opening, in at least a first approximation, is formed by a surface cutout of a body of rotation with the axis as the rotation body axis, and a bordering surface of the workpiece carrier is formed, in at least a first approximation, by a surface cutout of the rotation body.

42. A method for manufacturing vacuum treated workpieces comprising the steps of:

providing a vacuum chamber comprising at least one opening for treatment of at least one workpiece, providing a conveying device rotationally movable in a driven manner about an axis, at least one of inside and of outside said vacuum chamber and having at least one workpiece carrier, said workpiece carrier being alignable with said opening by rotation of said conveying device, providing a bordering surface of said at least one opening at least in a first approximation formed by a surface cutout of a body of rotation with the axis as the rotation body axis, providing a bordering surface of said workpiece carrier at least in a first approximation by a surface cutout of said rotation body, depositing a workpiece to be vacuum treated on said workpiece carrier, bringing said workpiece with said workpiece carrier in alignment with said opening and establishing between said bordering surfaces one of a diaphragm seal, a seal established by drivingly moving said bordering surface of said workplace carrier towards said bordering surface of said at least one opening or by activating a controllable sealing member between said bordering surfaces.

* * * * *